United States Patent
Kai et al.

(10) Patent No.: US 10,199,314 B2
(45) Date of Patent: Feb. 5, 2019

(54) SEMICONDUCTOR DEVICE, METAL MEMBER, AND METHOD OF MANUFACTURING SEMICONDUCTOR DEVICE

(71) Applicant: FUJI ELECTRIC CO., LTD., Kawasaki-shi (JP)

(72) Inventors: Kenshi Kai, Matsumoto (JP); Rikihiro Maruyama, Matsumoto (JP); Makoto Isozaki, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 89 days.

(21) Appl. No.: 15/091,447

(22) Filed: Apr. 5, 2016

(65) Prior Publication Data
US 2016/0343647 A1 Nov. 24, 2016

(30) Foreign Application Priority Data
May 18, 2015 (JP) .................................. 2015-101407

(51) Int. Cl.
*H01L 23/498* (2006.01)
*H01L 23/00* (2006.01)

(52) U.S. Cl.
CPC ........ *H01L 23/49811* (2013.01); *H01L 24/08* (2013.01); *H01L 24/80* (2013.01);
(Continued)

(58) Field of Classification Search
CPC . H01L 2224/48091; H01L 2224/48472; H01L 2224/45015; H01L 2224/85447; H01L 24/48; H05K 2201/10242; H05K 2201/10333; H05K 3/3426; H01R 13/111; H01R 13/432
See application file for complete search history.

(56) References Cited

U.S. PATENT DOCUMENTS

| | | | | |
|---|---|---|---|---|
| 4,247,981 A | * | 2/1981 | Walters | H05K 3/321 257/532 |
| 2003/0096526 A1 | * | 5/2003 | Balsells | H01R 13/187 439/346 |

(Continued)

FOREIGN PATENT DOCUMENTS

| | | |
|---|---|---|
| JP | 2011-233753 A | 11/2011 |
| JP | 2014-123618 A | 7/2014 |

*Primary Examiner* — Bilkis Jahan
*Assistant Examiner* — Victor Barzykin
(74) *Attorney, Agent, or Firm* — Rabin & Berdo, P.C.

(57) ABSTRACT

A flange on first open end of a tubular contact member is soldered to a conductive plate of an insulating substrate. An external electrode terminal is fitted into a main body tube portion of the tubular contact member. The tubular contact member includes a protrusion that protrudes inwardly from an inner wall of the main body tube portion. The protrusion is disposed along the entire perimeter of inner wall toward the first open end. The protrusion has a thickness deformation of the protrusion by a load applied thereto when the external electrode terminal is pressed into the main body tube portion. The protrusion is disposed at a height that can block solder that climbs the inner wall of the main body tube portion, to form a gap between the protrusion and a lower end of the external electrode terminal inserted to a predetermined depth of the main body tube portion.

19 Claims, 10 Drawing Sheets

(52) U.S. Cl.
CPC .................. *H01L 2224/081* (2013.01); *H01L 2224/08501* (2013.01); *H01L 2224/80365* (2013.01); *H01L 2224/80801* (2013.01)

(56) References Cited

U.S. PATENT DOCUMENTS

| | | | |
|---|---|---|---|
| 2004/0139775 A1* | 7/2004 | Patterson | B21D 17/04 |
| | | | 72/118 |
| 2005/0079745 A1* | 4/2005 | Ju | H01R 4/028 |
| | | | 439/67 |
| 2009/0194884 A1* | 8/2009 | Stolze | H01L 25/072 |
| | | | 257/773 |
| 2011/0266686 A1 | 11/2011 | Yamaguchi | |
| 2012/0269599 A1* | 10/2012 | Malek | H01R 4/028 |
| | | | 411/427 |

\* cited by examiner

FIG. 6

| 2×w1/d1 | RESULT |
|---|---|
| 0.1 | × |
| 0.2 | ○ |
| 0.3 | ○ |
| 0.5 | ○ |
| 0.7 | ○ |
| 0.8 | ○ |

FIG. 7

| t1 (mm) | RESULT |
|---|---|
| 0.1 | ○ |
| 0.5 | ○ |
| 1.0 | ○ |
| 1.3 | ○ |
| 1.6 | ○ |
| 2.0 | × |

| h1 (mm) | RESULT |
|---|---|
| 0.5 | × |
| 1 | ○ |
| 2 | ○ |
| 3 | ○ |
| 4 | ○ |

| h1 (mm) | h2 (mm) | RESULT |
|---|---|---|
| 2 (=h2) | 2 | ○ |
| 4 (=2×h2) | 2 | ○ |
| 5 (=2.5×h2) | 2 | × |

SEMICONDUCTOR DEVICE, METAL MEMBER, AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2015-101407, filed on May 18, 2015, the entire contents of which are incorporated herein by reference.

BACKGROUND OF THE INVENTION

1. Field of the Invention

The embodiments discussed herein are related to a semiconductor device, a metal member, and a method of manufacturing a semiconductor device.

2. Description of the Related Art

A semiconductor device such as, for example, a semiconductor module conventionally has a configuration having a semiconductor chip, other components, and the like bonded by solder to a conductive plate on the surface of an insulating substrate. A device has been proposed as the semiconductor module, whose conductive plate and an external electrode terminal are electrically connected to each other by fitting an external electrode terminal into a hollow-tube metal member (hereinafter, referred to as "tubular contact member") that is bonded by solder to the conductive plate on the front face of the insulating substrate (see, e.g., US Patent Publication No. 2009/194884). In US Patent Publication No. 2009/194884, the external electrode terminal and the tubular contact member are firmly fitted with each other by setting the largest dimension of the bottom face of the external electrode terminal to be slightly greater than the diameter of the hollow portion of the tubular contact member.

The configuration of the tubular contact member and the external electrode terminal of the conventional semiconductor module will be described. FIG. 12 is a cross-sectional diagram of a configuration of main portions of the conventional semiconductor module. FIG. 13 is a plan diagram of the configuration of the main portions of the conventional semiconductor module. FIG. 13 depicts the planar shapes of the hollow portion 104 and the external electrode terminal 125 of the tubular contact member 110 as viewed when a main body tube portion 101 of the tubular contact member 110 of FIG. 12 is cut along a cutting plane XY orthogonal to the central axis of the main body tube portion 101 and a multi-layered substrate 120 is viewed from the cutting plane XY. FIGS. 12 and 13 respectively correspond to FIGS. 14 and 12 of US Patent Publication No. 2009/194884.

As depicted in FIGS. 12 and 13, the tubular contact member 110 includes the hollow-tube main body tube portion 101, and flanges 102 and 103 respectively disposed on both of open ends 110a and 110b of the main body tube portion 101. The flange 102 of the first open end 110a of the tubular contact member 110 is bonded by solder (not depicted) to a conductive plate 122 of the front face of the multi-layered substrate 120. The multi-layered substrate 120 is formed by disposing the conductive plate 122 using copper (Cu) foil on the front face of a ceramic substrate 121 and disposing a sheet of copper foil 123 on the back face of the ceramic substrate 121. The tubular contact member 110 is electrically connected to a semiconductor chip 124 through the conductive plate 122 and a wire not depicted.

One end of the external electrode terminal 125 protrudes from a through hole 127 of a case 126 to outside of the case 126. The other end of the external electrode terminal 125 is fixed by being pressed into the main body tube portion 101 (the hollow portion 104) of the tubular contact member 110, to be fitted into the tubular contact member 110. The external electrode terminal 125 is electrically connected to the semiconductor chip 124 through the tubular contact member 110. The external electrode terminal 125 has a substantially square columnar shape and the largest dimension (the length of the diagonal line) d102 of the bottom face is slightly greater than the inner diameter (the diameter of the hollow portion 104) d101 of the main body tube portion 101 of the tubular contact member 110 (d101<d102). The planar shape of the main body tube portion 101 of the tubular contact member 110 is slightly deformed to match the shape of the bottom face of the external electrode terminal 125.

The following problem however arises with the conventional semiconductor module having the configuration depicted in FIGS. 12 and 13 where the external electrode terminal 125 is pressed into the main body tube portion 101 of the tubular contact member 110 to fit the external electrode terminal 125 therein. FIGS. 10, 11A, and 11B are schematic cross-sectional diagrams of states during manufacture of the conventional semiconductor module. FIG. 10 depicts an example of defective soldering attributable to the solderbility (the soldering property) when the tubular contact member 110 is soldered to the multi-layered substrate 120. FIGS. 11A and 11B depict an example of defects occurring when the external electrode terminal 125 is pressed into the main tube portion 101 of the tubular contact member 110.

As depicted in FIG. 10, when the flange 102 of the first open end 110a of the tubular contact member 110 is bonded by solder 128 to the multi-layered substrate 120, the solder 128 climbs up to an inner wall 110c of the main body tube portion 101 due to capillary action. In this case, the solder 128 tends to climb up the inner wall 110c of the main body tube portion 101 depending on the shape of the hollow portion 104 of the tubular contact member 110. According to a method of soldering the multi-layered substrate 120 and the tubular contact member 110 to each other, the paste-like solder 128 is disposed on the multi-layered substrate 120 and the tubular contact member 110 is placed on the solder 128 to be heated in a reflow furnace. In this case, generation of voids in the solder 128 is prevented by decreasing the pressure in the reflow furnace to remove gas present in the solder 128. When the pressure in the reflow furnace is decreased, however, the solder 128 may spatter when the gases present in the solder 128 expand. As a result, the solder 128 climbs up the inner wall 110c of the main body tube portion 101 from the first open end 110a to the second open end 110b (an insertion opening of the external electrode terminal 125) of the tubular contact member 110 and the solder 128 may remain on the inner wall 110c of the main body tube portion 101 in a state, for example, where the solder 128 does not smoothly spread out but is substantially hardened in a thick form.

When the solder 128 climbs up, as depicted in FIG. 11A, the external electrode terminal 125 cannot be inserted to a position deeper (toward the conductive plate 122) than solder 128a adhering to the inner wall 110c of the main body tube portion 101. When the external electrode terminal 125 is inserted, a load is applied to the external electrode terminal 125 at a point where the solder 128a adheres of the inner wall 110c of the main body tube portion 101. As depicted in FIG. 11B, the external electrode terminal 125 may thereby be bent or broken. Alternatively, the solder 128 bonding the main body tube portion 101 and the conductive plate 122 to each other may be broken and the main body tube portion 101 may become detached from the conductive plate 122 by insertion of the external electrode terminal 125 when the solder 128a has adhered to the inner wall 110c of the main body tube portion 101. The external electrode terminal 125 tends to drop off from the tubular contact member 110. Defective connection may therefore occur between the semiconductor chip 124 and the external electrode terminal 125.

SUMMARY OF THE INVENTION

According to one aspect of the present invention a metal member has ends that are open, among which a first open end is bondable to a semiconductor chip or a conductive plate by soldering. The metal member includes a tube portion that has a hollow tube shape and from a second open end among the ends, an external electrode terminal is inserted and fitted into the tube portion; and a first protrusion that is on an inner wall of the tube portion toward the first open end, and protrudes inwardly in a direction orthogonal to a central axis of the tube portion.

In the metal member, the first protrusion is disposed along an entire perimeter of the inner wall.

The metal member further includes a flange at the first open end. The flange protrudes outwardly in a direction orthogonal to the central axis.

In the metal member, a thickness of the first protrusion is at least 0.1 mm and not more than 1.6 mm.

The metal member has an inner diameter d and a ratio of a width w of the first protrusion to the inner diameter d satisfies $0.2 \leq 2 \times w/d \leq 0.8$.

In the metal member, the first protrusion is positioned such that a height from a soldering face to a face of the first protrusion, facing toward the first open end is at least 1 mm.

In the metal member, the first protrusion has a rectangular cross-sectional shape.

In the metal member, the first protrusion has a thickness that decreases toward the central axis and a cross-sectional shape of a triangular shape or a trapezoidal shape.

The metal member further includes a second protrusion that is on the inner wall toward the second open end, and protrudes inwardly in the direction orthogonal to the central axis.

In the metal member, the second protrusion is positioned such that a height from the second open end to a face of the second protrusion, facing the second open end is at least 1 mm.

In the metal member, the first protrusion is fitted to be fixed to the inner wall.

In the metal, the second protrusion is fitted to be fixed to the inner wall.

In the metal member, the first protrusion is formed by inwardly deforming a portion of a side wall of the tube portion.

In the metal member, the second protrusion is formed by inwardly deforming a portion of a side wall of the tube portion.

Embodiments of the invention include a semiconductor device in which the first open end of the metal member is soldered to the semiconductor chip or the conductive plate.

Embodiments of the invention further include a method of manufacturing a semiconductor device including an insulating substrate on which the semiconductor chip and the conductive plate are mounted. The method includes soldering the first open end of the metal member to the semiconductor chip or the conductive plate and fitting the external electrode terminal into the metal member by pressing the external electrode terminal into the metal member from the second open end of the metal member.

In the method, in fitting the external electrode terminal, the pressed external electrode terminal has a pointed end.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 6 is a table of verification results for the width of the protrusion of the semiconductor device according to Example 1;

FIG. 7 is a table of verification results for the thickness of the protrusion of the semiconductor device according to the second embodiment;

DETAILED DESCRIPTION OF THE INVENTION

Figure 1A:
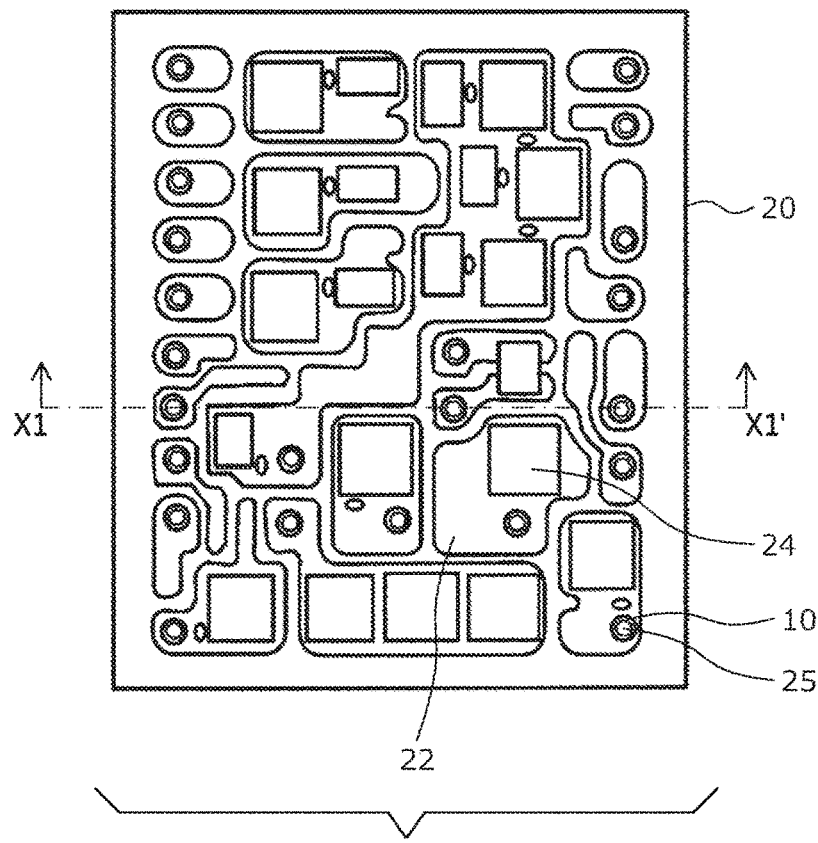
FIG. 1A is an explanatory diagram of a configuration of a semiconductor device according to a first embodiment as shown from a top-down perspective.

Embodiments of a semiconductor device, a metal member, and a method of manufacturing a semiconductor device will be described in detail with reference to the accompanying drawings. In the description of the embodiments and the accompanying drawings, identical components are given the same reference numerals and redundant description is omitted herein.

Figure 1B:
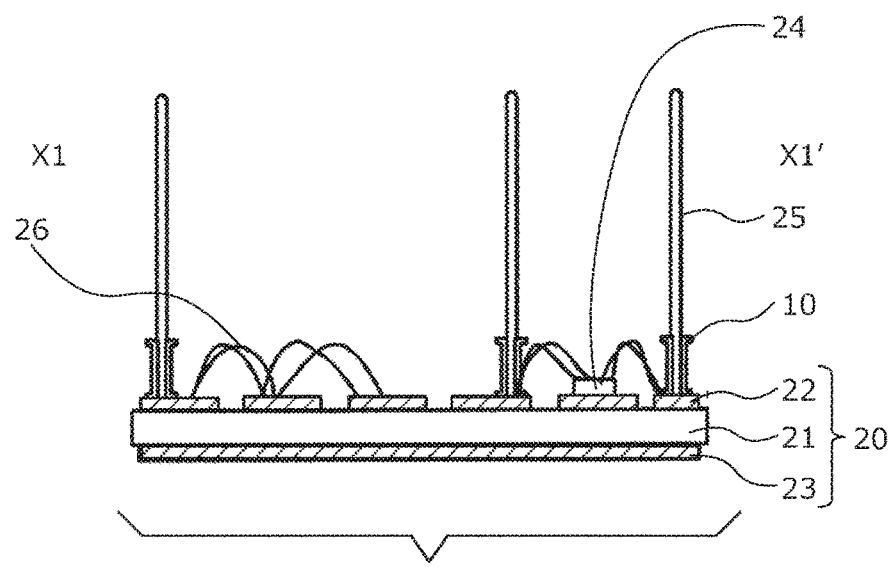
FIG. 1B is an explanatory diagram of a configuration of a semiconductor device according to the first embodiment as shown from a side perspective.
Figure 2A:
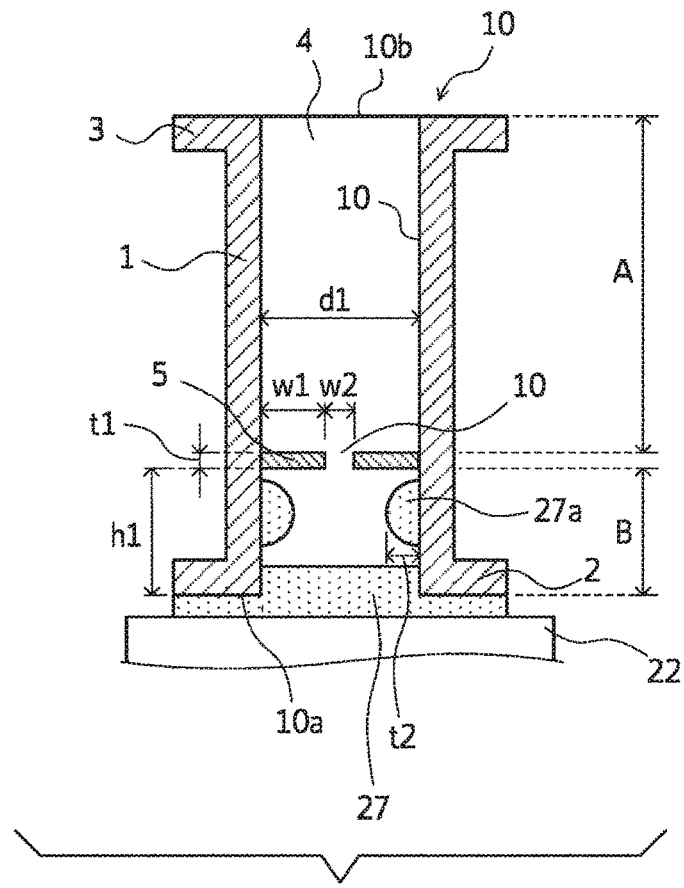
FIG. 2A is a detailed explanatory diagram of main portions of the semiconductor device according to the first embodiment as shown from a cross-sectional perspective.
Figure 2B:
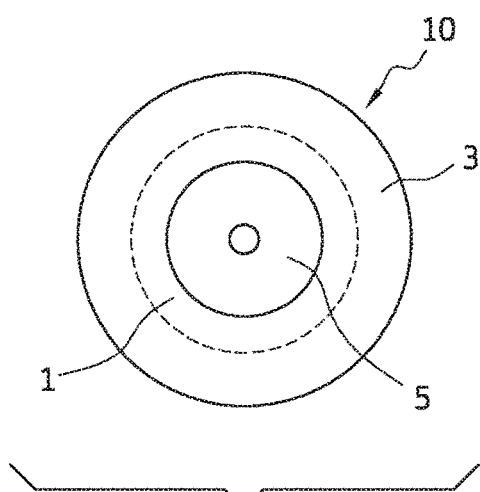
FIG. 2B is a detailed explanatory diagram of main portions of the semiconductor device according to the first embodiment as shown from a top-down.
Figure 2C:
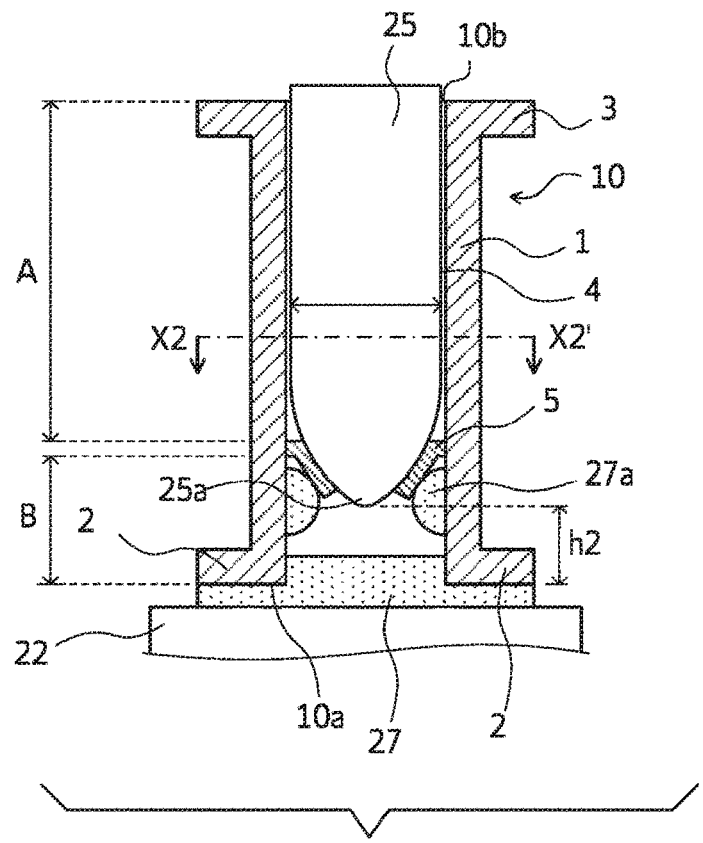
FIG. 2C is a detailed explanatory diagram of main portions of the semiconductor device according to the first embodiment as shown from a cross-sectional perspective.
Figure 2D:
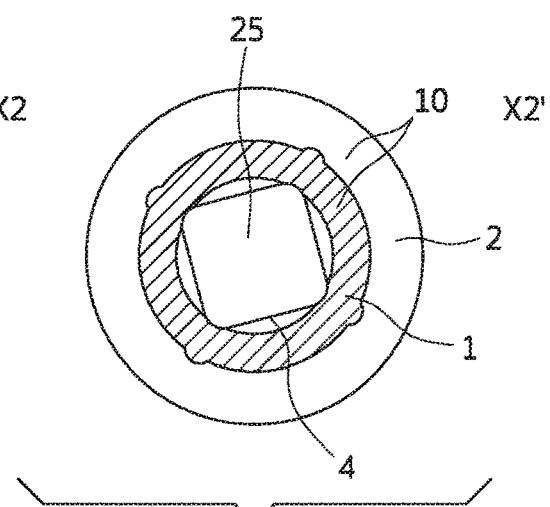
FIG. 2D is a detailed explanatory diagram of main portions of the semiconductor device according to the first embodiment as shown from a top-down cross-sectional perspective.

A configuration of the semiconductor device according to a first embodiment will be described. FIGS. 1A and 1B are explanatory diagrams of a configuration of the semiconductor device according to the first embodiment. FIGS. 2A, 2B, 2C, and 2D provide detailed explanatory diagrams of main portions of the semiconductor device according to the first embodiment. FIG. 1B depicts a cross-sectional view of the semiconductor device cut along a cutting line X-X' of FIG. 1A, as viewed from the cross section in a depth direction of the multi-layered substrate 20. In FIGS. 1A and 1B, a case (not shown) may cover the front face of the multi-layered substrate 20. In FIG. 1A, a wire 26 depicted in FIG. 1B is not depicted. FIG. 2A is a cross-sectional diagram of a cross-sectional structure of a tubular contact member 10 that is joined to a conductive plate 22. FIG. 2B is a plan diagram of a planar structure of the tubular contact member 10 depicted in FIG. 2A, as viewed from the side of an open end 10b. FIG. 2C is a cross-sectional diagram of a state where an external electrode terminal 25 is fitted into a main body tube portion 1 of the tubular contact member 10. FIG. 2D is a plan diagram of planar shapes of a hollow portion 4 of the tubular contact member 10 and the external electrode terminal 25, as viewed from the cutting plane X2 in FIG. 2C toward the multi-layered substrate 20.

The semiconductor device according to the first embodiment depicted in FIGS. 1A and 1B is a semiconductor module of a configuration in which a semiconductor chip 24, other components, and the like are bonded by solder (not depicted) to the conductive plate 22 on the front face of the multi-layered substrate 20 in a predetermined planar layout based on design conditions. For example, the semiconductor device according to the first embodiment is a semiconductor device that has the first open end 10a of the tubular contact member 10 bonded by solder 27 to the semiconductor chip 24 or the conductive plate 22 on the multi-layered substrate 20, and the external electrode terminal 25 inserted from the second open end 10b to be fitted into the tubular contact member 10. The multi-layered substrate 20 is formed by, for example, disposing the conductive plate 22 using copper (Cu) foil on the front face of an insulting substrate 21 and disposing copper foil 23 on the back face of the insulating substrate 21. A ceramic such as alumina or aluminum nitride is used as the insulating substrate 21. The copper foil 23 on the back face of the multi-layered substrate 20 is bonded by solder to, for example, a heat sink not depicted. The conductive plate 22 on the front face of the multi-layered substrate 20 has the semiconductor chip 24 and the tubular contact member (the metal member) 10 arranged thereon. The back face electrode (not depicted) of the semiconductor chip 24 is bonded by solder (not depicted) to the conductive plate 22. A front face electrode (not depicted) is disposed on the semiconductor chip 24 and the front face electrode is electrically connected to the conductive plate 22 through the wire 26. The front face electrode of the semiconductor chip 24 may be bonded to the second open end of the tubular contact member 10 through the solder 27.

As depicted in FIGS. 2A, 2B, 2C, and 2D, the tubular contact member 10 is a metal member that includes a hollow-tube main body tube portion 1, flanges (ring flanges) 2 and 3 respectively disposed on the open ends 10a and 10b of the main body tube portion 1, and a protrusion 5 disposed inside (the hollow portion 4) the main body tube portion 1.

The material of the tubular contact member 10 may be a material that is an excellent conductor, that satisfies a predetermined strength, and that has an excellent bonding property for the solder 27. For example, the material of the tubular contact member 10 may be copper or a copper alloy. Copper plating or nickel (Ni) plating may be applied to the surface (an inner wall 10c or an outer wall) of the main body tube portion 1 of the tubular contact member 10. The tubular contact member 10 is soldered to the conductive plate 22 and is electrically connected to the front face electrode of the semiconductor chip 24 through the conductive plate 22 and the wire 26. The tubular contact member 10 may also be directly bonded by solder to the front face electrode of the semiconductor chip 24. The external electrode terminal 25 is fitted into the main body tube portion 1 of the tubular contact member 10 and is electrically connected to the front face electrode of the semiconductor chip 24 through the tubular contact member 10.

For example, the main body tube portion 1 has a hollow-tube shape of a predetermined length enabling stable fixation of the external electrode terminal 25. The inner diameter (the diameter of the hollow portion 4) d1 of the main body tube portion 1 is slightly greater than the diameter d2 of the external electrode terminal 25 to the extent that the external electrode terminal 25 can be fitted therein. The flanges 2 and 3 have ring-like (sword guard) shapes outwardly protruding for a predetermined width in a direction orthogonal to a central axis of the main body tube portion 1 (a lateral direction in FIGS. 2A-2D) respectively from the open ends 10a and 10b of the main body tube portion 1, and are each disposed, for example, around the entire perimeter of the outer wall of the main body tube portion 1. The flange 2 of the first open end 10a of the main body tube portion 1 is bonded by the solder 27 to the conductive plate 22 of the front face of the multi-layered substrate 20. According to one embodiment, the flange 2 is disposed only on the open end 10a to be bonded by solder to the conductive plate 22 of the main body tube portion 1, and no flange may be located on the open end 10b. The position of the protrusion 5 relative to the first open end 10a of the main body tube portion 1 can thereby be recognized using the presence or the absence of the flange 2 as described later, and the selection of the orientation is facilitated when the tubular contact member 10 is bonded by solder. On the other hand, the structure enabling the attachment of the protrusion 5 without selecting the orientation during disposal of the tubular contact member 10 can be achieved by disposing both of the flanges 2 and 3 respectively on the open ends 10a and 10b of the main body tube portion 1. The work efficiency can thereby be improved when the tubular contact member 10 is formed. The method of forming the tubular contact member 10 will be described later.

The first open end 10a (the lower end of the tubular contact member 10) of the tubular contact member 10 (the main body tube portion 1) is closed by the soldering thereof to the conductive plate 22. The end face of the first open end 10a of the tubular contact member 10 becomes a bonding face with the solder 27. Although the first open end 10a of the tubular contact member 10 need not completely be closed by the solder 27, the flange 2 and the conductive plate 22 are soldered to each other. The second open end 10b (the upper end of the tubular contact member 10) of the tubular contact member 10 (the main body portion 1) is open and acts as an insertion opening for the external electrode terminal 25. The protrusion 5 is arranged toward the first open end 10a of the tubular contact member 10. As depicted in FIG. 2B, the protrusion 5 has a ring shape, for example, protruding inwardly for a predetermined width w1 in the direction orthogonal to the central axis of the main body tube portion 1 from the inner wall 10c of the main body tube portion 1, and is disposed along the entire perimeter of the inner wall 10c of the main body tube portion 1. With this protrusion 5 defining a boundary of two regions A and B, the hollow portion 4 of the tubular contact member 10 is divided in a first region A between the protrusion 5 and the second open end 10b of the tubular contact member 10 and a second region B between the protrusion 5 and the first open end 10a of the tubular contact member 10. The protrusion 5 may be formed by a member other than the main body tube portion 1, or may be formed by deforming the main body tube portion 1. In other words, in one embodiment, the protrusion is integral with the main body tube portion 1, made up of the same material as the main body tube portion 1 and having no separate physical or connecting material between the protrusion 5 and the main body tube portion 1. In another embodiment, the protrusion 5 is a separate structure, device, or apparatus from the main body tube portion 1 that is mechanically connected to, or set within, the main body tube portion. An example of the protrusion 5 formed by deforming the main body tube portion 1 will be described in a third embodiment later. Examples of the protrusion 5 being a separate structure from the main body tube portion 1 include a ring structure soldered or glued within the main body tube portion 1, or a ring structure held at a predetermined location within the main body tube portion 1 by a ridge, bump, or trough within the main body tube portion 1.

The protrusion 5 has a function of preventing the solder 27a from climbing up the inner wall 10c of the main body tube portion 1 due to capillary action or spattering when the tubular contact member 10 is soldered, and from climbing up to the first region A, which is toward the upper end of the tubular contact member 10, or spattering. The preventing the solder 27a from the climbing up and the spattering refers to prevention thereof to an extent that the solder 27a does not climb up from the side of the lower end of the tubular contact member 10 to the first region A and does not spatter, or an extent that, even when the solder 27a climbs up to the first region A or spatters, no defective manufacturing is caused during the insertion of the external electrode terminal 25. Defective manufacturing caused during the insertion of the external electrode terminal 25 refers to a case where the external electrode terminal 25 cannot be inserted up to the predetermined depth or a case where the external electrode terminal 25 is bent or broken during the insertion. The protrusion 5 has a function of substantially blocking the solder 27a from climbing up the inner wall 10c of the main body tube portion 1 or spattering, within the second region B, which is toward the lower end of the tubular contact member 10. The protrusion 5 prevents the solder 27 bonding the tubular contact member 10 and the conductive plate 22 to each other from being broken whereby the main body tube portion 1 detaches from the conductive plate 22. The protrusion 5 may therefore be disposed along the entire perimeter of the inner wall 10c of the main body tube portion 1. However, the protrusion 5 need not be disposed along the entire perimeter when the solder 27a can be prevented from the climbing up and the spattering.

In one embodiment, the width w1 of the protrusion 5 is narrower than a half of the inner diameter d1 of the main body tube portion 1. For example, the width w1 of the protrusion 5 may satisfy $0.2 \leq 2 \times w1/d1 \leq 0.8$ for the inner diameter d1 of the main body tube portion 1. The protrusion 5 acts as a boundary to divide the inner wall 10c of the main body tube portion 1 into separate regions, and has a ring-like planar shape having an outer diameter equal to the inner diameter d1 of the main body tube portion 1 and having, for example, a predetermined inner diameter w2 formed by a substantially circular hole 5a positioned in a vicinity of the central axis of the main body tube portion 1. The protrusion 5 does not completely close the portion between the first region A and the second region B, and the first region A and the second region B are continuous regions.

When the portion between the first region A and the second region B is completely closed by the protrusion 5 having the circular planar shape (w2=0), dissolved gases (gases) such as the solder flux generated when the tubular contact member 10 is soldered cannot escape outside of the tubular contact member 10. The dissolved gases generate voids (gas bubbles) inside the solder 27 and cause defective soldering. Therefore, the protrusion 5 may be disposed to have a planar shape of a ring with a hole (hereinafter, referred to as "hole portion") 5a of a width that enables dissolved gases to flow from the second open end 10b of the tubular contact member 10 to the outside thereof by connecting the first region A and the second region B to each other in a direction parallel to the central axis of the main body tube portion 1.

The hole portion 5a of the protrusion 5 has, for example, a circular planar shape. The inner diameter (the width (the diameter) of the hole portion 5a) w2 of the protrusion 5 may be set to be a dimension that enables dissolved gases generated when the tubular contact member 10 is soldered to completely escape from the second open end 10b of the tubular contact member 10 to the outside thereof. The position, the dimensions, and the planar shape of the hole portion 5a of the protrusion 5 suffice to enable the first region A and the second region B to be connected to each other in a direction parallel to the central axis of the main body tube portion 1. A size of the hole portion 5a may have a predetermined area calculated to allow the dissolved gases generated when the tubular contact member 10 is soldered to completely escape to the outside of the tubular contact member 1.

The protrusion 5 has a thickness t1 that is constant in a direction orthogonal to the central axis of the main body tube portion 1, and has a substantially rectangular cross-sectional shape. The protrusion 5 can have a predetermined strength by setting the cross-sectional shape of the protrusion 5 to be the substantially rectangular shape. In this embodiment, a substantially rectangular shape is defined as having substantially flat surfaces facing the open ends 10a and 10b, a substantially flat surface facing the inner wall 10c of the main body tube portion 1, and a substantially flat surface defining the perimeter of the hole 5a. When the cross-sectional shape of the protrusion 5 is set to be the substantially rectangular shape, the tubular contact member 10 can be produced at a low cost because the shape of the protrusion 5 is simple. The thickness t1 of the protrusion 5 may be set to be a thickness that enables the protrusion 5 to be deformed easily by the load applied thereto when the external electrode terminal 25 is pressed (inserted) into the main body tube portion 1 of the tubular contact member 10. The thickness t1 of the protrusion 5 is set to be a thickness that, for example, enables the hole portion 5a of the protrusion 5 to be widened and deformed by the load applied thereto when the external electrode terminal 25 is inserted therein. For example, the thickness t1 of the protrusion 5 can be adjusted depending on the constituent material, the inner diameter w2, and the production method of the protrusion 5, and may be, for example, about 0.1 mm or greater and about 1.6 mm or less ($0.1 \text{ mm} \leq t1 \leq 1.6 \text{ mm}$). As depicted in FIG.

2D, the planar shape along the cutting plane XY of the external electrode terminal 25 (the shape of the bottom face of the external electrode terminal 25) may be, for example, a substantially square shape. The external electrode terminal 25 can thereby be firmly fitted into the main body tube portion 1 of the tubular contact member 10. In one embodiment, the lower end (the end toward the multi-layered substrate 20) 25a of the external electrode terminal 25 is rounded or pointed. The reason for this is that the protrusion 5 can easily be deformed by the lower end 25a of the external electrode terminal 25 when the external electrode terminal 25 is pressed (inserted) into the main body tube portion 1 of the tubular contact member 10.

In one embodiment, a height h1 at which the protrusion 5 is disposed is a height by which the height from the lower face (the surface toward the multi-layered substrate 20) of the flange 2 of the first open end 10a of the tubular contact member 10 to the lower face of the protrusion 5 is, for example, about 1 mm or greater (h1≤1 mm). The reason for this is as follows. A height h2 of the lower end 25a of the external electrode terminal 25 when the external electrode terminal 25 is fitted into the tubular contact member 10 is, for example, about 0.5 mm or greater and about 2.0 mm or less from the lower face of the flange 2 of the first open end 10a of the tubular contact member 10. The climbing up and the spattering of the solder 27a can therefore be prevented in the gap formed up to the lower end 25a of the external electrode terminal 25 even when the solder 27a climbs up the inner wall 10c of the main body tube portion 1 or spatters, by setting the height h1 at which the protrusion 5 is disposed to be about 1 mm or greater. The height h1 at which the protrusion 5 is disposed is set to be a height by which the solder 27a climbing up the inner wall 10c of the main body tube portion 1 or spattered can be blocked, such that the gap is formed with the lower end 25a of the external electrode terminal 25 inserted up to the predetermined depth of the main body tube portion 1. In an embodiment in which the tubular contact member 10 does not include one or both of the flanges 2 and 3, the height h1 at which the protrusion 5 is disposed is the height from the end face of the first open end 10a of the tubular contact member 10 to the lower face of the protrusion 5.

In one embodiment, the height h1 at which the protrusion 5 is disposed satisfies h1≤2×h2 for the height h2 of the lower end 25a of the external electrode terminal 25. For example, the height h1 at which the protrusion 5 is disposed may be, for example, about 4 mm or less (h1≤4 mm). When the height h1 at which the protrusion 5 is disposed is set to be greater than 4 mm, a length of the second region B (the region within which the solder 27a climbs up or spatters) is large relative to an entire length of the hollow portion 4 and thus a length of the portion exposed in the second region B of the external electrode terminal 25 is large. In such a case, even when the climbing up or the spattering of the solder 27a is blocked within the second region B, adverse effects on the external electrode terminal 25 by the solder 27a climbing up or spattering within the second region B cannot therefore be suppressed. Therefore, in one embodiment, the height h1 at which the protrusion 5 is disposed satisfies 1≤h1≤2×h2.

As described above, the protrusion 5 has the width w1 by which the climbing up and the spattering of the solder 27a can be blocked within the second region B when the tubular contact member 10 is soldered, and has the thickness t1 by which the insertion of the external electrode terminal 25 is not obstructed. In other words, in one embodiment, the thickness t1 is selected in combination with the material that makes up the protrusion 5 to allow for the protrusion 5 to be deformed by the external electrode terminal 25 when the external electrode terminal 25 is inserted into the tubular contact member 10. The protrusion 5 is disposed at the height h1 by which the external electrode terminal 25 is not adversely affected by the solder 27a climbing up from the lower end of the tubular contact member 10 to the second region B or spattering. In one embodiment, the constituent material of the protrusion 5 is the same metal material as that of the main body tube portion 1 of the tubular contact member 10. The reason for this is that the metal material is excellent in both of conductivity and strength. When the constituent materials of the tubular contact member 10 and the protrusion 5 are selected to be different from each other, electrical resistance may increase or cracks may be generated by the stress in the joining part between the tubular contact member 10 and the protrusion 5. The constituent material of the protrusion 5 may however be a material different from that of the main body tube portion 1 depending on the method of disposing the protrusion 5, or may be a material having low solder wettability such as carbon or ceramic. When the materials of the tubular contact member 10 and the protrusion 5 are selected to be different from each other, the constituent material of the protrusion 5 may be a material that does not react with the sealing material and that can withstand the heat during soldering.

To manufacture (fabricate) the semiconductor device according to the first embodiment, the first open end 10a of the tubular contact member 10 is bonded by solder 27 to the semiconductor chip 24 or the conductive plate 22 mounted on the insulating substrate 21 (a first step). The external electrode terminal 25 is fitted into the tubular contact member 10 by pressing the external electrode terminal 25 from the second open end 10b of the tubular contact member 10 therein (a second step). For example, at the first step, the paste-like or the plate-like solder 27 is disposed on the semiconductor chip 24 or the conductive plate 22, the tubular contact member 10 is placed on the solder 27 with the first open end 10a thereof oriented toward the insulating substrate 21, and heat is applied thereto in a reflow furnace. In this manner, the first open end 10a of the tubular contact member 10 is bonded by the solder 27 to the front face electrode of the semiconductor chip 24 or the conductive plate 22. At the second step, the external electrode terminal 25 is fitted into the second open end 10b of the tubular contact member 10 by pressing the external electrode terminal 25 therein. The external electrode terminal 25 is thereby fitted into the tubular contact member 10 deforming the protrusion 5 disposed in the inner wall 10c of the first open end 10a of the tubular contact member 10.

The method of producing the tubular contact member 10 will be described. The tubular contact member 10 having the main body tube portion 1 and the flanges 2 and 3, and the protrusion 5 having the ring-like planar shape may be each individually formed (produced). A positioning jig is inserted into the inside of the main body tube portion 1 from, for example, the first open end 10a of the tubular contact member 10 such that the surface of the positioning jig is positioned at the height h1 at which the protrusion 5 is disposed. The protrusion 5 is inserted into the main body tube portion 1 from the second open end 10b of the tubular contact member 10 to fit the protrusion 5 into the main body tube portion 1 aligning the protrusion 5 with the position of the height of the positioning jig. In this case, the diameter of the protrusion 5 may be set to be greater than the inner diameter of the main body tube portion 1 by about 100 μm. Detachment of the protrusion 5 from the main body tube portion 1 can thereby be prevented after the protrusion 5 is fitted into the main body tube portion 1. Alternatively, the protrusion 5 may be disposed on the positioning jig and the main body tube portion 1 may be fitted into the positioning jig from above. In this manner, the tubular contact member 10 including the main body tube portion 1, the flanges 2 and 3, and the protrusion 5 is completed. In one embodiment, an alloy such as stainless steel or an ultra-hard alloy such as tungsten carbide is used as the material of the positioning jig from the viewpoint of the strength. According to this method, the tubular contact member 10 including the protrusion 5 can be produced regardless of the constituent material of the protrusion 5.

As described, according to the first embodiment, the solder can be prevented from climbing up the inner wall of the main body tube portion or spattering up to the first region that is higher than the protrusion when the tubular contact member is soldered, by disposing the protrusion having the ring-like planar shape, along the entire perimeter of the inner wall of the main body tube portion, toward the lower end of the tubular contact member. The solder climbing up the inner wall of the main body tube portion or spattering can thereby be blocked at a lower portion of the tubular contact member. No load is therefore applied on the external electrode terminal by the solder when the external electrode terminal is inserted into the tubular contact member; or, the load on the external electrode terminal is negligible. Defective manufacturing can be eliminated such as failure to insert the external electrode terminal up to the predetermined depth, and bending or breakage of the external electrode terminal consequent to the solder climbing up the inner wall of the main body tube portion or spattering. The rate of non-defective products can therefore be improved.

According to the first embodiment, the external electrode terminal can be inserted in the tubular contact member up to the predetermined depth by forming the protrusion to have dimensions that enable the external electrode terminal to deform the protrusion by the force generated by the pressing of the external electrode terminal into the tubular contact member. Thus, the external electrode terminal is not easily detached from the tubular contact member. According to the first embodiment, defective manufacturing attributed to the insertion of the external electrode terminal can be eliminated, and measures and equipment for detecting defects concerning the fitting of the external electrode terminal into the tubular contact member are therefore unnecessary. According to the first embodiment, the effect of preventing the climbing up and the spattering of the solder can be achieved easily by disposing the protrusion on the tubular contact member, compared to other countermeasures such as a change of the specification of the solder material and surface treatment for the multi-layered substrate performed to suppress the climbing up and the spattering of the solder.

Figure 3A:
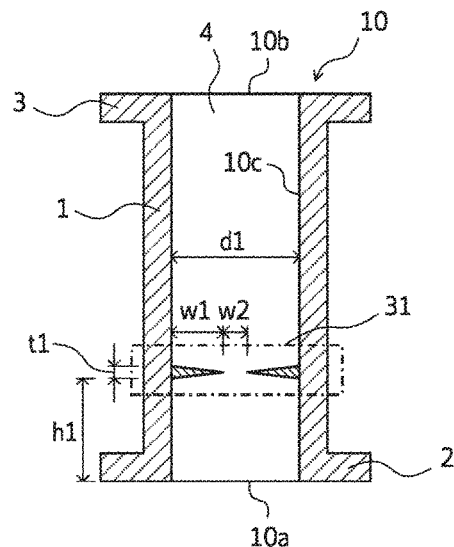
FIGS. 3A and 3B are cross-sectional diagrams of a configuration of the semiconductor device according to a second embodiment.
Figure 3B:
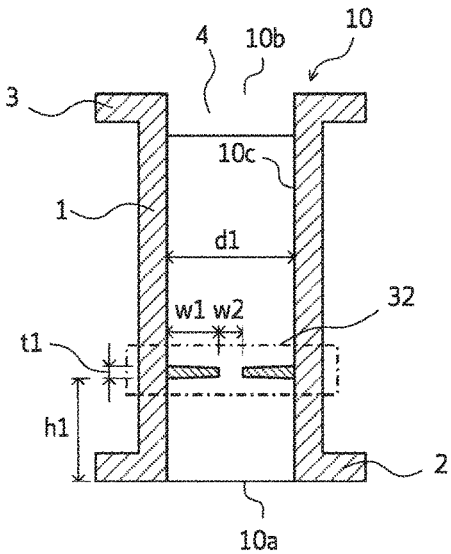

A configuration of a semiconductor device according to a second embodiment will be described. FIGS. 3A and 3B are cross-sectional diagrams of a configuration of the semiconductor device according to the second embodiment. The semiconductor device according to the second embodiment is different from the semiconductor device according to the first embodiment in the cross-sectional shape of each of protrusions 31 and 32 for preventing the climbing up and the spattering of the solder 27a, disposed on the inner wall 10c of the main body tube portion 1 of the tubular contact member 10.

For example, as depicted in FIG. 3A, the protrusion 31 (FIG. 3A) may have a cross-sectional shape of a substantially triangular shape. As illustrated in FIG. 3B, the protrusion 32 may have a cross-sectional shape of a substantially trapezoidal shape. In other words, in one embodiment, a thickness t1 of the protrusion (31 or 32) may become thinner toward the central axis of the main body tube portion 1 relative to an outer diameter of the protrusion (31 or 32). The widths w1 and the inner diameters w2 of the protrusions 31 and 32, and the heights h1 at which the protrusions 31 and 32 are disposed may be the same as those of the first embodiment depicted in FIGS. 2A to 2D.

A method of forming the tubular contact member 10 including the protrusion 31 or 32 having the cross-sectional shape of the substantially triangular shape or the substantially trapezoidal shape may be the same as that of the first embodiment, described above. The force to deform the protrusion 31 or 32 can be reduced when the external electrode terminal 25 is pressed into the tubular contact member 10, by setting the cross-sectional shape of each of the protrusions 31 and 32 to be the substantially triangular shape or the substantially trapezoidal shape. The external electrode terminal 25 can therefore be pressed into the tubular contact member 10 up to the predetermined depth with a smaller force.

Figure 4:
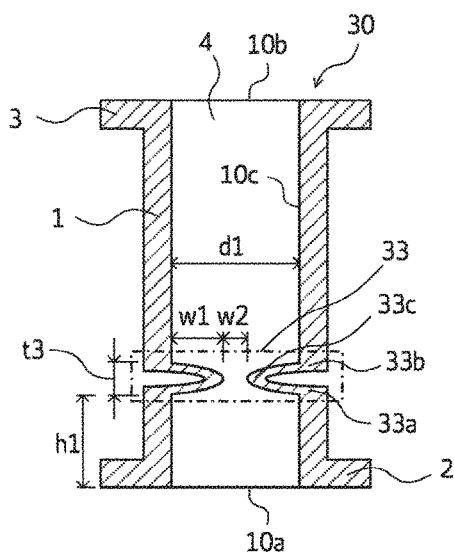
FIG. 4 is a cross-sectional diagram of a configuration of the semiconductor device according to a third embodiment.

A configuration of the semiconductor device according to a third embodiment will be described. FIG. 4 is a cross-sectional diagram of a configuration of the semiconductor device according to the third embodiment. The semiconductor device according to the third embodiment is different from the semiconductor device according to the first embodiment in that a protrusion 33 for preventing the climbing up and the spattering of the solder 27a is disposed by inward deformation of the side wall of the main body tube portion 1. For example, as depicted in FIG. 4, the protrusion 33 having a cross-sectional shape of a substantially semicircular shape or a substantially semi-elliptical shape and formed by inward deformation of a portion of the main body tube portion 1 is disposed along the entire perimeter of the side wall of the main body tube portion 1 of a tubular contact member 30.

The height h1 at which the protrusion 33 is disposed and the width w1 and the inner diameter w2 of the protrusion 33 may be equal to those of the first embodiment described in FIGS. 2A to 2D. The height h1 at which the protrusion 33 is disposed is the height from the lower face of the flange 2 of the first open end 10a of the tubular contact member 30 to a lower end (the end toward the multi-layered substrate 20) 33a of the protrusion 33. The ends 33a and 33b of the protrusion 33 are the points at which the side wall of the main body tube portion 1 starts to bend. The width w1 of the protrusion 33 is the distance from the inner wall 10c of the main body tube portion 1 to an apex 33c that is the most protruded point of the protrusion 33. The inner diameter w2 of the protrusion 33 is the distance between the apices 33c that are the most protruded points of the protrusion 33.

The width w1 and a thickness t3 of the protrusion 33 both correspond to the diameter of the protrusion 33 when the cross-sectional shape of the protrusion 33 is the substantially semicircular shape, and respectively correspond to the length of a half of the long axis and the length of the short axis of the protrusion 33 when the cross-sectional shape thereof is the semi-elliptical shape. The protrusion 33 is a portion where the metal thickness is reduced by deformation of the portion of the side wall of the main body tube portion 1 to be curved into the substantially semi-circular shape or the substantially semi-elliptical shape. The width w1 and the thickness t3 of the protrusion 33 are set to be dimensions by which the portion whose metal thickness is reduced by deformation of the portion of the side wall of the main body tube portion 1 can be set to have a metal thickness that is thin to the extent that the portion can be pressed toward the inner wall 10c of the main body tube portion 1 by the load generated when the external electrode terminal 25 is pressed.

The tubular contact member 30 including the protrusion 33 having the cross-sectional shape of the substantially semi-circular shape or the substantially semi-elliptical shape may be formed, for example, as follows. The tubular contact member 30 including the main body tube portion 1 and the flanges 2 and 3 is formed by, for example, casting. The main body tube portion 1 of the tubular contact member 30 is placed on a turning machine. A portion of the main body tube portion 1 is inwardly deformed along the entire perimeter of the side wall of the main body tube portion 1 by rotating the tubular contact member 30 around the central axis while pressing a bite of the predetermined shape to the outer wall of the main body tube portion 1. The tubular contact member 30 that includes the protrusion 33 having the cross-sectional shape of the substantially semicircular shape or the substantially semi-elliptical shape is thereby completed.

While a protrusion 33 having a substantially semi-circular or substantially elliptical shape has been described, embodiments of the invention encompass protrusions made up of walls of the main body tube portion 1 having any shape, including substantially triangular, substantially trapezoidal, substantially rectangular, substantially quarter-circular, substantially quarter-elliptical, or any other shape.

Figure 5:
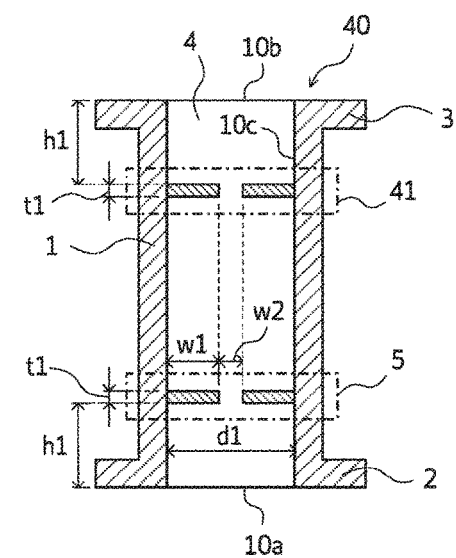
FIG. 5 is a cross-sectional diagram of a configuration of the semiconductor device according to a fourth embodiment.

A configuration of the semiconductor device according to a fourth embodiment will be described. FIG. 5 is a cross-sectional diagram of a configuration of the semiconductor device according to the fourth embodiment. The semiconductor device according to the fourth embodiment differs from the semiconductor device according to the first embodiment in that a protrusion (hereinafter, referred to as "second protrusion") for preventing the climbing up and spattering of the solder 27a is further disposed near the second open end 10b of the tubular contact member 40. In other words, a first protrusion 5 is located between a center of the main body tube portion 1 and the first open end 10a, and a second protrusion 41 is located between the center of the main body tube portion 1 and the second open end 10b. On the inner wall 10c of the main body tube portion 1 of the tubular contact member 40, the first protrusion 5 is disposed toward the first open end 10a and the second protrusion 41 is disposed toward the second open end 10b of the tubular contact member 40.

In the fourth embodiment, a symmetrical structure may be formed by disposing the flanges 2 and 3 respectively on both of the open ends 10a and 10b of the tubular contact member 40. The reason for this is as follows. The first and the second protrusions 5 and 41 are respectively disposed on the inner wall 10c of the main body tube portion 1, toward the open ends 10a and 10b to form a symmetrical structure. When either of the flanges 2 and 3 of the open ends 10a and 10b of the tubular contact member 40 is used as the bonding face with the conductive plate 22, the solder 27a climbing up the inner wall 10c of the main body tube portion 1 or spattering can be prevented from climbing up and spattering around the upper end of the tubular contact member 40 beyond the protrusion (the first protrusion 5 or the second protrusion 41) disposed toward the lower end of the tubular contact member 40. The tubular contact member 40 is structured such that the soldering can be conducted without selecting the orientation of the tubular contact member 40. Since either of the flanges 2 and 3 on the open ends 10a and 10b of the tubular contact member 40 may be used as the bonding face with the conductive plate 22, cases of defective manufacturing due to errors and the like can be reduced and work efficiency of manufacturing can be improved.

In other words, referring to FIG. 5, where C defines a center of the main body tube portion 1 between the first open end 10a and the second open end 10b, a first protrusion 5 is located between the center C and the first open end 10a, and a second protrusion 41 is located between the center C and the second open end 10b. In one embodiment, the first and second protrusions 5 and 41 are located equidistant from the center C of the main tube body portion 1.

The configuration of the first protrusion 5 is same as that of the first embodiment described in FIGS. 2A-2D. The configuration of the second protrusion 41 may be the same as the configuration of the first protrusion 5. The first and the second protrusions 5 and 41 are substantially plane-symmetrically disposed with respect to a cutting plane that is at the depth of a half of the overall length of the main body tube portion 1 in the central axis direction and that is orthogonal to the central axis of the main body tube portion 1. The second protrusion 41 suffices to satisfy the above conditions of the width w1, the inner diameter w2, and the height h1 at which the second protrusion 41 is disposed, and may have another configuration different from that of the first protrusion 5. The height h1 at which the second protrusion 41 is disposed is the height from the lower face of the flange 3 of the second open end 10b of the tubular contact member 40 to the upper face of the second protrusion 41 (the face facing toward the second open end 10b of the tubular contact member 40). The first and the second protrusions 5 and 41 are disposed away from each other on the positioning jig and the main body tube portion 1 is fitted into the positioning jig from above, as the method of forming the tubular contact member 40.

Figure 14:
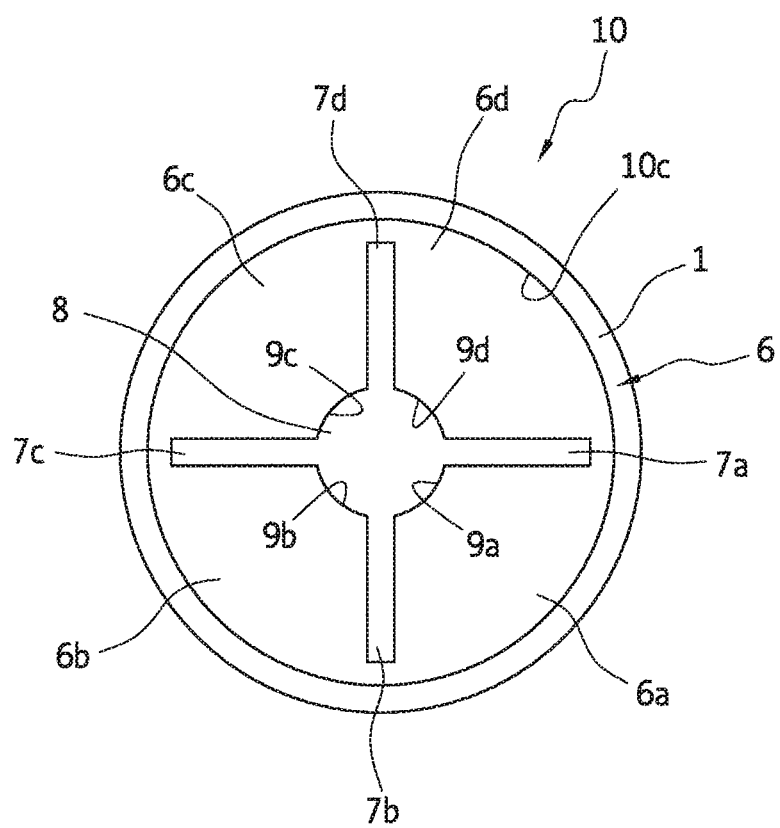
FIG. 14 is a diagram of a protrusion according to an embodiment of the invention.

FIG. 14 illustrates a top-down view of a tubular contact member 10 according to an embodiment of the invention. The tubular contact member 10 includes a main tube body portion 1 having a protrusion 6 therein. In the embodiment illustrated in FIG. 14, the protrusion is not a contiguous ring, but rather a ring broken into segments 6a, 6b, 6c, and 6d by slits 7a, 7b, 7c, and 7d. The inner surfaces 9a, 9b, 9c, and 9d of the segments 6a, 6b, 6c, and 6d define an outer diameter of a hole 8.

In one embodiment, the inner surfaces 9a, 9b, 9c, and 9d have arc-shapes that are parallel to an inner wall 10c of the tubular contact member 10. However, the inner surfaces 9a, 9b, 9c, and 9d may have any shape, including straight or flat shapes, or even pointed or substantially pointed shapes. For example, in an embodiment in which the inner surfaces 9a, 9b, 9c, and 9d have pointed or substantially pointed shapes, the inner surfaces 9a, 9b, 9c, and 9d may define apexes of substantially triangular-shaped segments 6a, 6b, 6c, and 6d, having rounded bases to correspond to the inner wall 10c of the tubular contact member.

Figure 15:
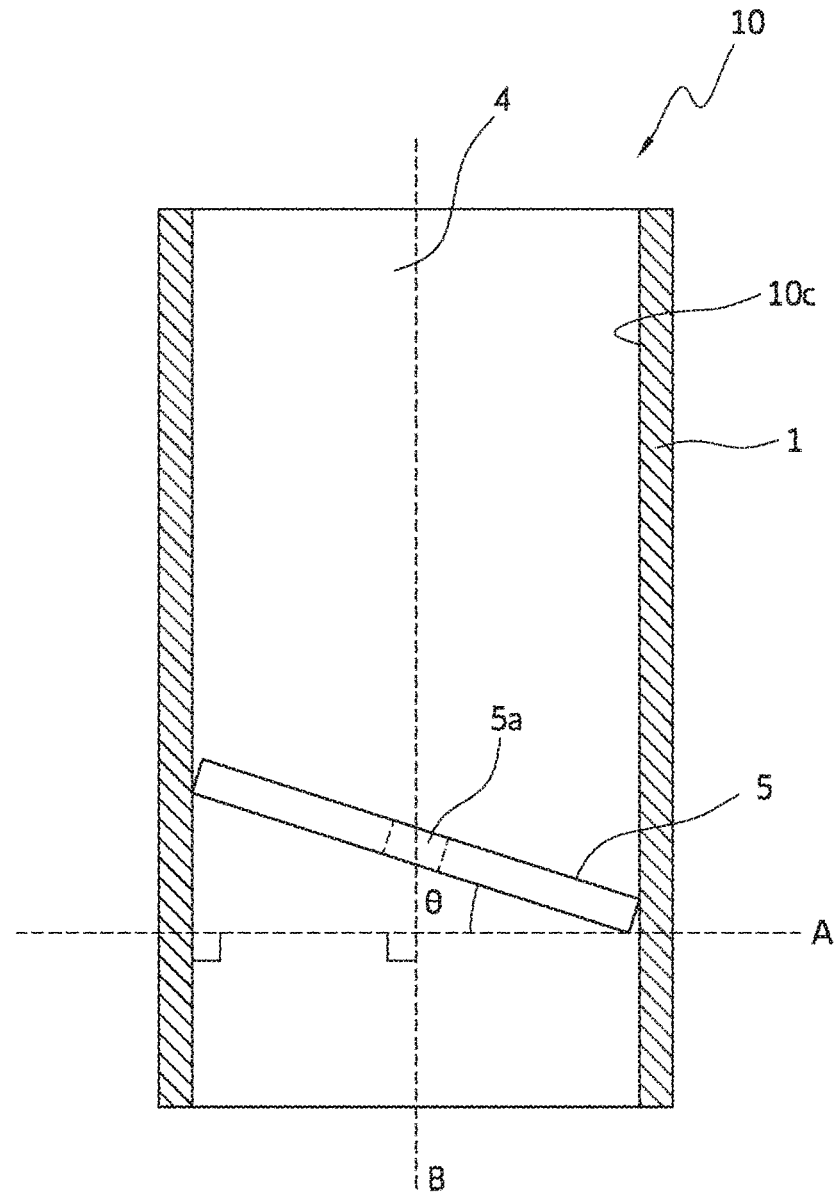
FIG. 15 is a diagram of a semiconductor device according to another embodiment of the invention.

FIG. 15 illustrates a tubular contact member 10 according to another embodiment of the invention. The tubular contact member 10 includes the main tube body portion 1 defining a hollow portion 4, and a protrusion 5 located within the tubular contact member 10. The protrusion 5 is disc-shaped and defines a hole 5a at a substantial center of the protrusion 5.

Embodiments of the invention include protrusions 5 that extend along plane A substantially perpendicularly to inner walls 10c of the tubular contact member 10, or substantially perpendicular to a center axis B of the tubular contact member 10. As illustrated in FIG. 15, embodiments also encompass protrusions arranged at an angle relative to the plane A. For example, tolerance levels during manufacturing may result in protrusions 5 that are not exactly perpendicular to the inner wall 10c. According to one embodiment, a protrusion 5 may be arranged at an angle θ within 15 degrees of perpendicular to plane A. However, embodiments encompass protrusions 5 arranged at any angle θ at which the protrusion 5 would still be fixed within the tubular contact member 10 and would be deformable by a predetermined level of force, such as a predetermined force applied by an external electrode terminal 25.

Embodiments of the invention are directed to a tubular contact member having a protrusion therein with characteristics such that the protrusion is configured to prevent solder splatter into a region of the tubular contact member on an opposite side of the tubular contact member from the protrusion. In embodiments of the invention, the protrusion includes a hole or opening to permit a free flow of gasses between regions of the tubular contact member separated by the protrusion.

In some embodiments of the invention, the protrusion is configured to be deformable when force is applied to the protrusion. For example, in one embodiment, an external electrode terminal is inserted into the tubular contact member after the tubular contact member is soldered to a surface, and the external electrode terminal presses against the protrusion to deform the protrusion toward the surface.

In some embodiments of the invention, the physical characteristics of the protrusion are such that the protrusion is deformable by a predetermined force applied to the protrusion. The physical characteristics include the material that makes up the protrusion, the width of the protrusion, and the length of the protrusion, measured from the inner wall of the tubular contact member to an inner surface of the protrusion defining a hole. For example, a protrusion having a smaller width may be made of a harder or less deformable material, while a protrusion having a larger width may need to be made of a more deformable material, to permit the external electrode terminal to deform the protrusion.

Accordingly, one embodiment of the invention includes a method of making the tubular contact member, or a semiconductor device including the tubular contact member, including determining a predetermined force to be applied to a protrusion within the tubular contact member, selecting physical characteristics of the protrusion to be deformable upon being subjected to the predetermined force, and forming or inserting the protrusion in the tubular contact member.

In one embodiment, the protrusion is integral with the tubular contact member. In other words, the protrusion may be formed from the tubular contact member by machining or manufacturing processes, including cutting and bending an inner surface of the tubular contact member, forming the protrusion during a molding process of the entire tubular contact member, forming the protrusion by applying force to an outer surface of the tubular contact member to deform the tubular contact member inward, or by any other manufacturing process.

In another embodiment, the protrusion is separate from the tubular contact member, buy mechanically attached to the tubular contact member. For example, the protrusion may be a disc, or may have a disc-shaped outer perimeter corresponding to an inner surface of the tubular contact member, and the protrusion may be inserted into the tubular contact member. The protrusion may be attached to the tubular contact member by gluing, soldering, welding, stamping, by force without any gluing or connecting material (such as if an outer diameter of the protrusion is the same or very slightly greater than an inner diameter of the tubular contact member), or by any other method. The protrusion may be positioned within the tubular contact member by contacting a bump, ledge, or trough within the tubular contact member, or by positioning without any particular feature on the inside surface of the tubular contact member.

In some embodiments, the protrusion is disc-shaped or substantially disc-shaped. In some embodiments, the hole in the protrusion is located substantially at the center of the disc-shaped protrusion, such that the protrusion has a ring shape. In some embodiments, the diameter of the hole is a contiguous and unbroken circular shape. In other embodiments, the protrusion includes multiple tabs or sections separated by slits.

In some embodiments, the protrusion includes at least two sides extending substantially perpendicularly from the inside wall of the tubular contact member towards each other along a same plane.

In some embodiments, an inner surface, or inner surfaces, of the protrusion defining the hole have shapes corresponding to a shape of the inner wall of the tubular contact member. For example, the tubular contact member may have a circular cross-sectional shape, and the inner surfaces of the protrusion may be circular or arc-shaped and may be parallel to the inner wall of the tubular contact member.

According to one embodiment, a metal member includes a tube portion including a first open end and a second open end opposite the first open end. A protrusion is located in a hollow portion defined by the tube portion, and the protrusion includes at least two opposite sides extending toward each other from opposite sides of an inner wall of the tube portion. The protrusion defines a hole between the at least two opposite sides of the protrusion.

According to another embodiment, a semiconductor device connection assembly includes an external electrode terminal and a metal member. The metal member includes a tube portion including a first open end and a second open end opposite the first open end. The metal member also includes a protrusion located in a hollow portion defined by the tube portion. The external electrode terminal is positioned within the tube portion of the metal member to extend out from the first open end, and to press against the protrusion to deform the protrusion in a direction towards the second open end.

EXAMPLE 1

Verification was conducted for the width w1 of the protrusion 5 for preventing the climbing up and the spattering of the solder 27a. FIG. 6 is a table of verification results for the width of the protrusion of the semiconductor device according to Example 1. Plural specimens were produced according to the configuration of the semiconductor device of the first embodiment by soldering the tubular contact members 10 each having a ratio of the width w1 of the protrusion 5 to the inner diameter d1 of the main body tube portion 1 (=2×w1/d1) that is different from each other. The height h1 at which the protrusion 5 is disposed was set to be 1 mm and the thickness t1 of the protrusion 5 was set to be 0.1 mm. A hollow-tube member having an inner diameter d1 of 1 mm was used as the main body tube portion 1. FIG. 6 depicts the results of determining presence or absence of the climbing up and the spattering of the solder 27a for the specimens. In FIG. 6, a case where the climbing up and the spattering of the solder 27a to the first region A were able to be prevented is represented by "o" and a case where the climbing up and the spattering of the solder 27a up to the first region A occurred is represented by "x".

From the results depicted in FIG. 6, it was confirmed that the climbing up and the spattering of the solder 27a from the second region B to the first region A were able to be prevented when the ratio of the width w1 of the protrusion 5 to the inner diameter d1 of the main body tube portion 1 satisfied 0.2≤2×w1/d1≤0.8. In this case, it was confirmed that the thickness t2 of the wet and climbing-up solder 27a was 0.3 mm. The thickness t2 of the wet and climbing-up solder 27a is the maximal thickness of the bulge of the solder 27a that bulges in an arc shape on the inner wall 10c of the main body tube portion 1 based on the surface tension (the interface tension between the solder 27a and the inner wall 10c of the main body tube portion 1) of the solder 27a climbing up on the inner wall 10c of the main body tube portion 1 and spattering. In one embodiment, the width w1 of the protrusion 5 is therefore 0.3 mm or greater. For example, when the inner diameter d1 of the main body tube portion 1 is 1 mm, the minimal width w1 of the protrusion 5 in the above range is 0.1 mm (0.2=2×w1 [mm]/1 [mm]). It was therefore confirmed that, when the width w1 of the protrusion 5 was a width of one third or greater of the thickness t2 of the wet and climbing-up solder 27a, the effect of preventing climbing up and spattering of the solder 27a was achieved (w1≥t2/3). Though not depicted, the inventors confirmed that the same effect could be achieved even when the height h1 at which the protrusion 5 is disposed was greater than 1 mm. The inventors confirmed that the same effect could also be achieved even when the thickness t1 of the protrusion 5 was greater than 0.1 mm.

EXAMPLE 2

Verification was next conducted for the thickness t1 of the protrusion 5 for preventing the climbing up and the spattering of the solder 27a. FIG. 7 is a table of verification results for the thickness of the protrusion of the semiconductor device according to the second embodiment. Plural specimens were produced according to the configuration of the semiconductor device of the first embodiment by soldering the tubular contact members 10 each having the thickness t1 of the protrusion 5 different from each other and by pressing the external electrode terminal 25 into the main body tube portion 1 of the tubular contact member 10. The pressing force to press the external electrode terminal 25 was set to be 5 kgf. FIG. 7 depicts the result of the determination as to whether the protrusion 5 was able to be deformed for each of the specimens. In FIG. 7, a case where the protrusion 5 could be deformed is represented by "∘" and a case where the protrusion 5 could not be deformed is represented by "x". The height h1 at which the protrusion 5 is disposed was set to be 1 mm. The ratio of the width w1 of the protrusion 5 to the inner diameter d1 of the main body tube portion 1 (=2×w1/d1) was set to be 0.2.

From the results depicted in FIG. 7, it was confirmed that the protrusion 5 could to be deformed by the load generated when the external electrode terminal 25 was pressed in cases where the thickness t1 of the protrusion 5 was in the range of 0.1 mm or greater and 1.6 mm or less.

EXAMPLE 3

Figures 8, 9, 10:
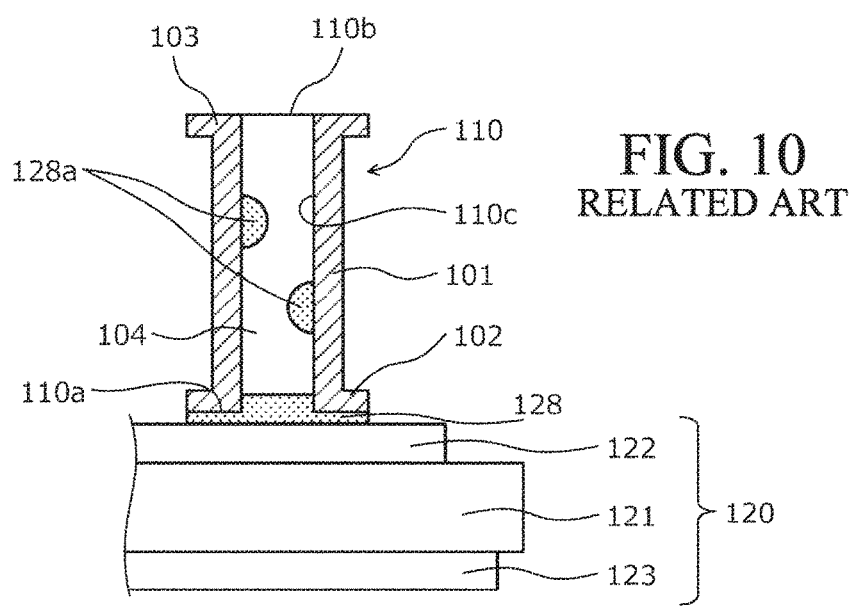
FIG. 8 is a table of verification results for the lower limit value of the height for disposing a protrusion of the semiconductor device according to Example 3.
FIG. 9 is a table of verification results for the upper limit value of the height for disposing the protrusion of the semiconductor device according to Example 3.
FIG. 10 is a schematic cross-sectional diagram of a conventional semiconductor module during assembly.
Figure 11A:
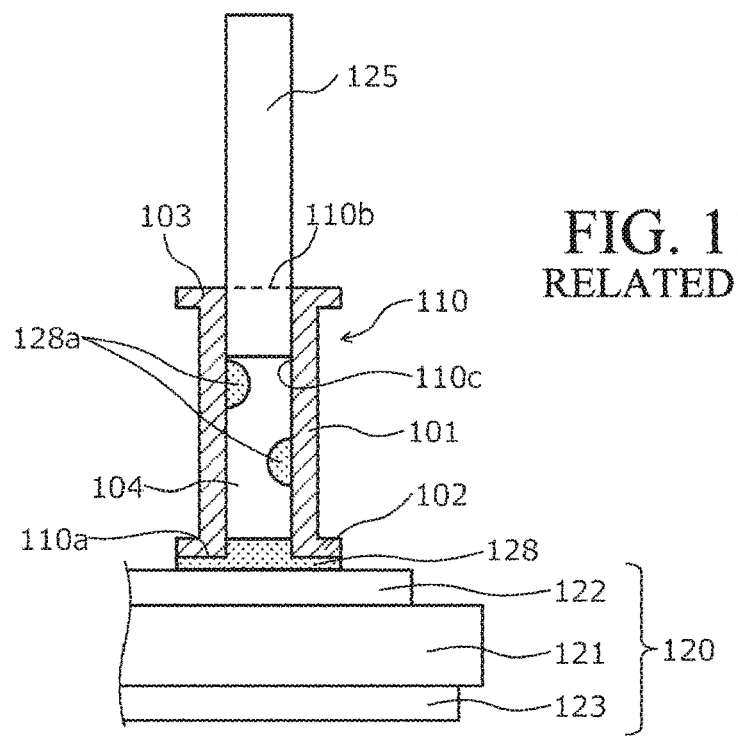
FIGS. 11A and 11B are cross-sectional diagram of a conventional semiconductor module during assembly.
Figure 11B:
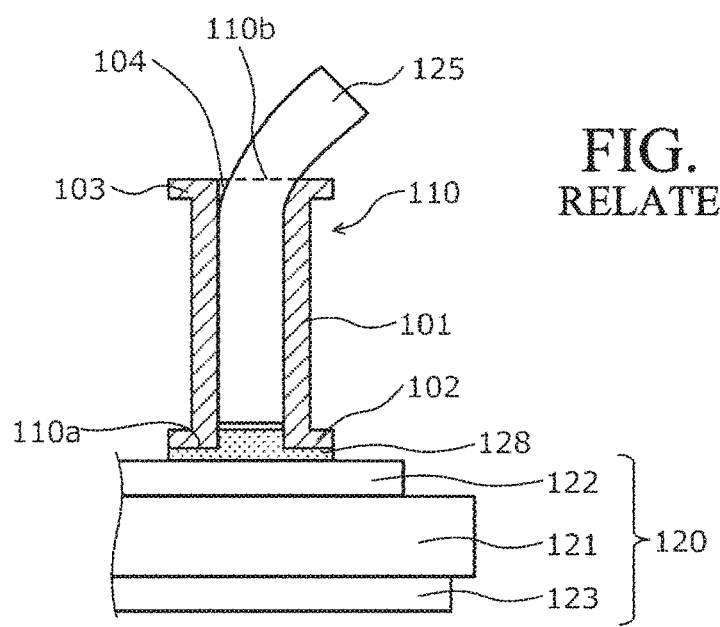
Figure 12:
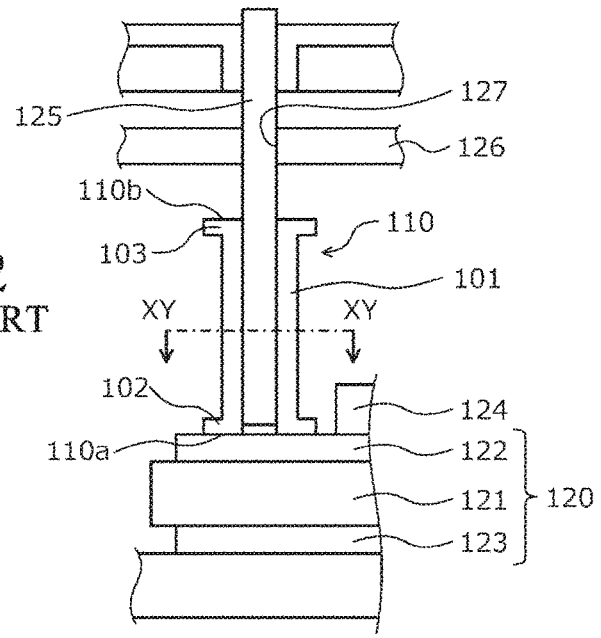
FIG. 12 is a cross-sectional diagram of a configuration of main portions of a conventional semiconductor module.
Figure 13:
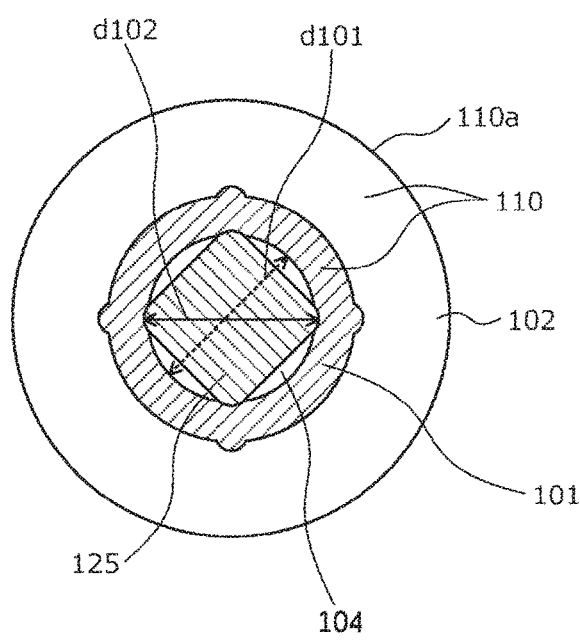
FIG. 13 is a plan diagram of the configuration of the main portions of the conventional semiconductor module.

Verification was next conducted for the height h1 at which the protrusion 5 is disposed for preventing the climbing up and the spattering of the solder 27a. FIG. 8 is a table of verification results for the lower limit value of the height for disposing the protrusion of the semiconductor device according to Example 3. FIG. 9 is a table of verification results for the upper limit value of the height for disposing the protrusion of the semiconductor device according to Example 3. Plural specimens were produced according to the configuration of the semiconductor device of the first embodiment by soldering the tubular contact members 10 each having the height h1 at which the protrusion 5 is disposed different from each other and by pressing the external electrode terminal 25 into the main body tube portion 1 of the tubular contact member 10. The ratio of the width w1 of the protrusion 5 to the inner diameter d1 of the main body tube portion 1 (=2×w1/d1) was set to be 0.2. The thickness t1 of the protrusion 5 was set to be 0.2 mm. In FIGS. 8 and 9, a case where the solder 27a did not climb up in the first region A toward the upper end of the tubular contact member 10 and did not spatter, and where the solder 27a did not cause defective manufacturing during the insertion of the external electrode terminal 25 even when the solder 27a climbed up to the first region A or spattered are represented by "∘" and a case where defective manufacturing was caused by the solder 27a that climbed up to the first region A or that spattered is represented by "x".

From the results depicted in FIG. 8, it was confirmed that, when the height h1 for disposing the protrusion 5 was 1 mm or greater, the height was excellent to the extent that the solder 27a did not climb up to the first region A or spatter, or no defective manufacturing was caused during the insertion of the external electrode terminal 25 even when the solder 27a climbed up to the first region A or spattered. It was also confirmed that the climbing up and the spattering of the solder 27a could be blocked within a range having the height h2 up to the lower end 25a of the external electrode terminal 25. From the results depicted in FIG. 9, it was also confirmed that, by setting the upper limit value of the height h1 at which the protrusion 5 is disposed to be h1≤2×h2 with respect to the height h2 of the lower end 25a of the external electrode terminal 25, the height was excellent to the extent that the solder 27a did not climb up to the first region A and spatter, and the solder 27a did not cause defective manufacturing during the insertion of the external electrode terminal 25 even when the solder 27a climbed up to the first region A or spattered. The height h1 for disposing the protrusion 5 is set to be 1 mm or greater and 4 mm or less (1 mm≤h1≤4 mm). FIG. 9 depicts a case as an example where the height h2 up to the lower end 25a of the external electrode terminal 25 was set to be 2 mm though the inventors confirmed that, even when the height h2 up to the lower end 25 of the external electrode terminal 25 was variously changed, the same effect could be achieved by setting the height h1 at which the protrusion 5 is disposed to be in the above range.

Although not depicted, the inventors confirmed that the results of Examples 1 to 3 were also obtained for the semiconductor devices according to the second to the fourth embodiments similarly to the first embodiment.

The present invention is not limited to the above embodiments and can variously be changed within a scope not departing from the spirit of the invention.

According to the disclosure, when the metal member is soldered, the solder climbing up the inner wall of the metal member or spattered can be prevented from climbing up to a point higher than the protrusion (toward the other end not joined to the conductive plate on the insulating substrate). The solder climbing up the inner wall of the metal member or spattered can thereby be blocked around the lower end of the metal member (toward the one end joined to the conductive plate on the insulating substrate). Therefore, when the external electrode terminal is inserted into the metal member, no load is applied to the external electrode terminal by the solder or the load on the external electrode terminal is negligible. Failed insertion of the external electrode terminal up to a predetermined depth, and bending and breakage of the external electrode terminal attributed to the solder climbing up the inner wall of the metal member or spattered can thereby be prevented.

According to the semiconductor device, the metal member, and the method of manufacturing a semiconductor device of the present invention, an effect is achieved in that defective assembly can be eliminated for the semiconductor device having a configuration where the external electrode terminal is inserted and fitted into the tubular contact member.

As described, the semiconductor device, the metal member, and the method of manufacturing a semiconductor device according to the present invention are useful for a semiconductor device such as a semiconductor module that has a configuration having a semiconductor chip, other components, and the like bonded by solder to a conductive plate on the surface of an multi-layered substrate, and are suitable for a semiconductor device that secures electrical connection with a conductive plate by fitting an external electrode terminal into a tubular contact member.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising a metal member comprising:
    a tube portion having a hollow tube shape and first and second open ends; and
    a first protrusion on an inner wall of the tube portion closer to the first open end than the second open end, the first protrusion including at least two opposing sides that protrude inwardly in a direction orthogonal to a central axis of the tube portion and define a hole between the at least two opposing sides,
    wherein the inner wall of the tube portion between the first open end and the first protrusion is smooth, such that the inner wall of the tube portion from the first open end to the first protrusion is a straight line when viewed in a cross-section,
    the first protrusion is disposed along an entire perimeter of the inner wall and has one of a rectangular cross-sectional shape and a tapered shape having a narrower inner end than an outer end in a radial direction, and
    the first open end is soldered to a semiconductor chip or a conductive plate.

2. The metal member according to claim 1 and further comprising
    a flange at the first open end, the flange protruding outwardly in a direction orthogonal to the central axis.

3. The metal member according to claim 1, wherein
    a thickness of the first protrusion is at least 0.1 mm and not more than 1.6 mm.

4. The metal member according to claim 1, wherein
    the metal member has an inner diameter d and a ratio of a width w of the first protrusion to the inner diameter d satisfies $0.2 \leq 2 \times w/d \leq 0.8$.

5. The metal member according to claim 1, wherein
    the first protrusion is positioned such that a height from a soldering face to a face of the first protrusion, facing toward the first open end is at least 1 mm.

6. The metal member according to claim 1, wherein
    the first protrusion has a rectangular cross-sectional shape.

7. The metal member according to claim 1, wherein
    the first protrusion has a thickness that decreases toward the central axis and a cross-sectional shape of a triangular shape or a trapezoidal shape.

8. The metal member according to claim 1, further comprising
    a second protrusion that is on the inner wall closer to the second open end than the first open end, and protrudes inwardly in the direction orthogonal to the central axis.

9. The metal member according to claim 8, wherein
    the second protrusion is positioned such that a height from the second open end to a face of the second protrusion, facing the second open end is at least 1 mm.

10. The metal member according to claim 1, wherein
    the first protrusion is fitted to be fixed to the inner wall.

11. The metal member according to claim 8, wherein
    the second protrusion is fitted to be fixed to the inner wall.

12. The metal member according to claim 1, wherein
    the first protrusion is formed by inwardly deforming a portion of a side wall of the tube portion.

13. The metal member according to claim 8, wherein
    the second protrusion is formed by inwardly deforming a portion of a side wall of the tube portion.

14. A method of manufacturing a semiconductor device comprising an insulating substrate on which a semiconductor chip and a conductive plate are mounted, the method comprising:
    soldering a first open end of a metal member to the semiconductor chip or the conductive plate, the metal member including a tube portion having a hollow tube shape and first and second open ends, the metal member including a first protrusion on an inner wall of the tube portion and including at least two opposing sides that protrude inwardly in a direction orthogonal to a central axis of the tube portion and define a hole between the at least two opposing sides, wherein
    the inner wall of the tube portion between the first open end and the first protrusion is smooth, such that the inner wall of the tube portion from the first open end to the first protrusion is a straight line when viewed in a cross-section, and
    the first protrusion is disposed along an entire perimeter of the inner wall and has one of a rectangular cross-sectional shape and a tapered shape having a narrower inner end than an outer end in a radial direction; and
    fitting an external electrode terminal into the metal member by pressing the external electrode terminal into the metal member from the second open end of the metal member.

15. The method, according to claim 14, wherein the pressed external electrode terminal has a pointed end, and
    fitting the external electrode terminal into the metal member includes pressing the pointed end against the protrusion.

16. The method according to claim 14, wherein fitting the external electrode terminal into the metal member includes deforming the protrusion by the external electrode terminal.

17. A metal member, comprising:
    a tube portion including a first open end and a second open end opposite the first open end; and
    a protrusion located in a hollow portion defined by the tube portion, the protrusion including at least two opposite sides extending toward each other from opposite sides of an inner wall of the tube portion, the protrusion defining a hole between the at least two opposite sides of the protrusion, wherein the inner wall of the tube portion between the first open end and the protrusion is smooth, such that the inner wall of the tube portion from the first open end to the protrusion is a straight line when viewed in a cross-section, the protrusion is disposed along an entire perimeter of the inner wall and has one of a rectangular cross-sectional shape and a tapered shape having a narrower inner end than an outer end in a radial direction, and the first open end is soldered to a semiconductor chip or a conductive plate.

18. The metal member of claim 17, wherein the protrusion is disc-shaped.

19. A semiconductor device connection assembly, comprising:

an external electrode terminal; and a metal member, the metal member comprising:

a tube portion including a first open end and a second open end opposite the first open end; and a protrusion located in a hollow portion defined by the tube portion, wherein the external electrode terminal is positioned within the tube portion of the metal member to extend out from the second open end, and to press against the protrusion to deform the protrusion in a direction towards the first open end, the protrusion is disposed along an entire perimeter of an inner wall of the tube portion, and the first open end of the metal member is soldered to a semiconductor chip or a conductive plate.

* * * * *